United States Patent
Ichikawa et al.

(10) Patent No.: US 7,668,695 B2
(45) Date of Patent: Feb. 23, 2010

(54) SENSOR MALFUNCTION DETERMINATION DEVICE AND SENSOR MALFUNCTION DETERMINATION METHOD

(75) Inventors: Hiromitsu Ichikawa, Sumida-ku (JP); Hiromasa Hada, Kokubunji (JP); Takao Kokubu, Akishima (JP)

(73) Assignee: Bridgestone Corporation, Tokyo (JP)

( * ) Notice: Subject to any disclaimer, the term of this patent is extended or adjusted under 35 U.S.C. 154(b) by 247 days.

(21) Appl. No.: 11/884,843

(22) PCT Filed: Feb. 21, 2006

(86) PCT No.: PCT/JP2006/303033
§ 371 (c)(1),
(2), (4) Date: Aug. 22, 2007

(87) PCT Pub. No.: WO2006/090690
PCT Pub. Date: Aug. 31, 2006

(65) Prior Publication Data
US 2008/0255805 A1 Oct. 16, 2008

(30) Foreign Application Priority Data
Feb. 22, 2005 (JP) ............................. 2005-046124
Feb. 22, 2005 (JP) ............................. 2005-046130

(51) Int. Cl.
*G06F 11/30* (2006.01)
(52) U.S. Cl. ..................... 702/183; 702/34; 702/35; 702/116; 73/146.2; 73/146.3; 73/146.5; 340/442; 340/443; 180/313

(58) Field of Classification Search ............. 702/34–35, 702/116, 183; 73/146.2, 146.3, 146.5; 340/442–443; 180/313
See application file for complete search history.

(56) References Cited

U.S. PATENT DOCUMENTS

| 5,671,981 | A | * | 9/1997 | Sasaki et al. | ............ | 303/122.06 |
| 6,408,690 | B1 | * | 6/2002 | Young et al. | ................ | 73/146.5 |
| 7,171,301 | B2 | * | 1/2007 | Yu et al. | ..................... | 701/114 |

FOREIGN PATENT DOCUMENTS

| JP | 9-104211 A | 4/1997 |
| JP | 11-78447 A | 3/1999 |
| JP | 2004-9781 A | 1/2004 |
| JP | 2005-170133 A | 6/2005 |
| JP | 2006-8019 A | 1/2006 |

OTHER PUBLICATIONS

Module J502, 'Tires—Tire Pressure Monitoring', 2003, Audi-A8 Tire Monitoring System, pp. 36-65.*
Audi, 'Audi, Auto Data', 2003, pp. 1-3.*

* cited by examiner

*Primary Examiner*—Edward Raymond
*Assistant Examiner*—Elias Desta
(74) *Attorney, Agent, or Firm*—Sughrue Mion, PLLC

(57) ABSTRACT

The present invention includes a sensor malfunction determination unit 207 detects the pressure value corresponding to a signal outputted by a pressure sensor 101 capable of measuring the internal pressure of a pneumatic tire 10. When the detected pressure value is decreasing along the time axis, the sensor malfunction determination unit 207 determines that the pressure sensor 101 is not malfunctioning.

12 Claims, 10 Drawing Sheets

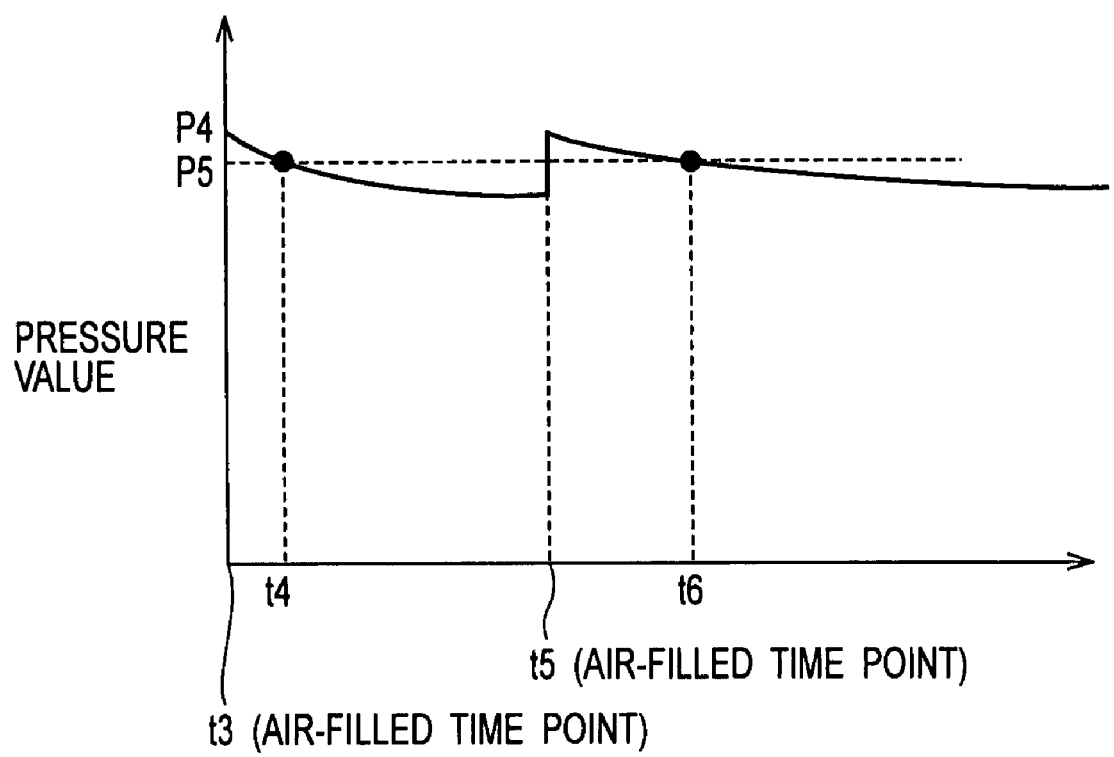

SENSOR MALFUNCTION DETERMINATION DEVICE AND SENSOR MALFUNCTION DETERMINATION METHOD

TECHNICAL FIELD

The present invention relates to a sensor malfunction determination device including a pressure sensor capable of measuring the internal pressure of a pneumatic tire, and also relates to a sensor malfunction determination method.

BACKGROUND ART

In recent years, vehicles have been provided with a tire data transmission device and a tire information reception device. Specifically, the tire data transmission device is provided for a rim on which a pneumatic tire is mounted. The tire data transmission device provides a pressure sensor capable of measuring the internal pressure of the pneumatic tire.

The tire data transmission device wirelessly transmits a pressure value, which corresponds to a signal outputted by the pressure sensor, to the tire information reception device (an ECU or the like) (for example, JP-A H9-104211). Then, the tire information reception device displays the pressure value thus received.

The driver or the like of the vehicle can find out the pressure value of the pneumatic tire from the display. Accordingly, when the pressure value of the pneumatic tire is not more than a regulated pressure value, the driver or the like can take this opportunity to inflate the pneumatic tire.

Since the pressure value of the pneumatic tire is taken as an index for maintaining the driving stability of the vehicle, it is desirable for the driver or the like to inspect the pressure sensor frequently to find out more precise pressure value.

DISCLOSURE OF THE INVENTION

However, when the driver or the like inspects a pressure sensor by himself/herself, he/she needs firstly to do some work, for example, to detach the pressure sensor by using a specialized tool, and then to inspect the pressure sensor by using a specialized device. On the other hand, when the driver or the like does not inspect the pressure sensor by himself/herself, he/she needs to drive the vehicle to a specialty shop providing the inspection service of the pressure sensor.

Accordingly, since the driver or the like feels that the inspecting of the pressure sensor requires lots of time and effort, the driver or the like often neglects the inspecting of the pressure sensor.

The present invention has been made in view of the above described circumstances. An object of the present invention is to provide a sensor malfunction determination device and a sensor malfunction determination method, each of which is capable of informing the driver or the like whether or not a pressure sensor is malfunctioning.

For the purpose of solving the above problems, a first characteristic of the present invention includes a pressure value detection unit, a determination unit, and an output unit. The pressure value detection unit detects a pressure value corresponding to a signal outputted by a pressure sensor capable of measuring the internal pressure of a pneumatic tire. The determination unit determines the pressure sensor is not malfunctioning, when the detected pressure value is decreasing along the time axis. The output unit outputs the determination result made by the determination unit.

According to the above characteristic, when the detected pressure value is decreasing along the time axis, air in the pneumatic tire is leaking along the time axis. This means that the pressure sensor is precisely measuring the internal pressure of the pneumatic tire. In this case, a determination result, which indicates the pressure sensor is not malfunctioning, is outputted. With the determination result, the driver or the like of the vehicle (hereinafter, referred to as the driver or the like) can easily find out whether or not the pressure sensor is malfunctioning.

A second characteristic of the present invention is characterized by an approximate expression calculation unit that calculates an approximate expression on the basis of a plurality of the pressure values and time points when a plurality of the pressure values are detected. The second aspect of the present invention also provides the following characteristic. When a value, which indicates the slope of the approximate expression calculated from relations between a plurality of detected pressure values and time points when a plurality of the pressure values are detected, is a negative predetermined value or less, the determination unit determines the pressure sensor is not malfunctioning.

A third characteristic of the present invention is characterized by the determination unit determining the pressure sensor is malfunctioning when the detected pressure value is constant along the time axis.

A fourth characteristic of the present invention is characterized by further including a time point detection unit detecting an air-filled time point, which is a time point when the pneumatic tire is inflated. The fourth characteristic of the present invention also provides the following characteristic. The determination unit uses, the pressure value detected after the air-filled time point on the basis of the detected air-filled time point.

A fifth characteristic of the present invention is characterized by the time point detection unit detecting the air-filled time point when an increase in the detected pressure value exceeds a reference value over a reference time period.

A sixth characteristic of the present invention is characterized by the determination unit determining the pressure sensor is malfunctioning when the amplitude of a pressure signal indicating a variation in the detected pressure value along the time axis exceeds a reference amplitude, and concurrently when a frequency of the pressure signal exceeds a reference frequency over a predetermined time period.

BRIEF DESCRIPTION OF THE DRAWINGS

FIG. 6 is a graph showing a variation in the pressure value with respect to the time axis, according to a second embodiment.

BEST MODES FOR CARRYING OUT THE INVENTION

First Embodiment

Configurations of Pneumatic Tire and Rim Wheel

Figure 1:
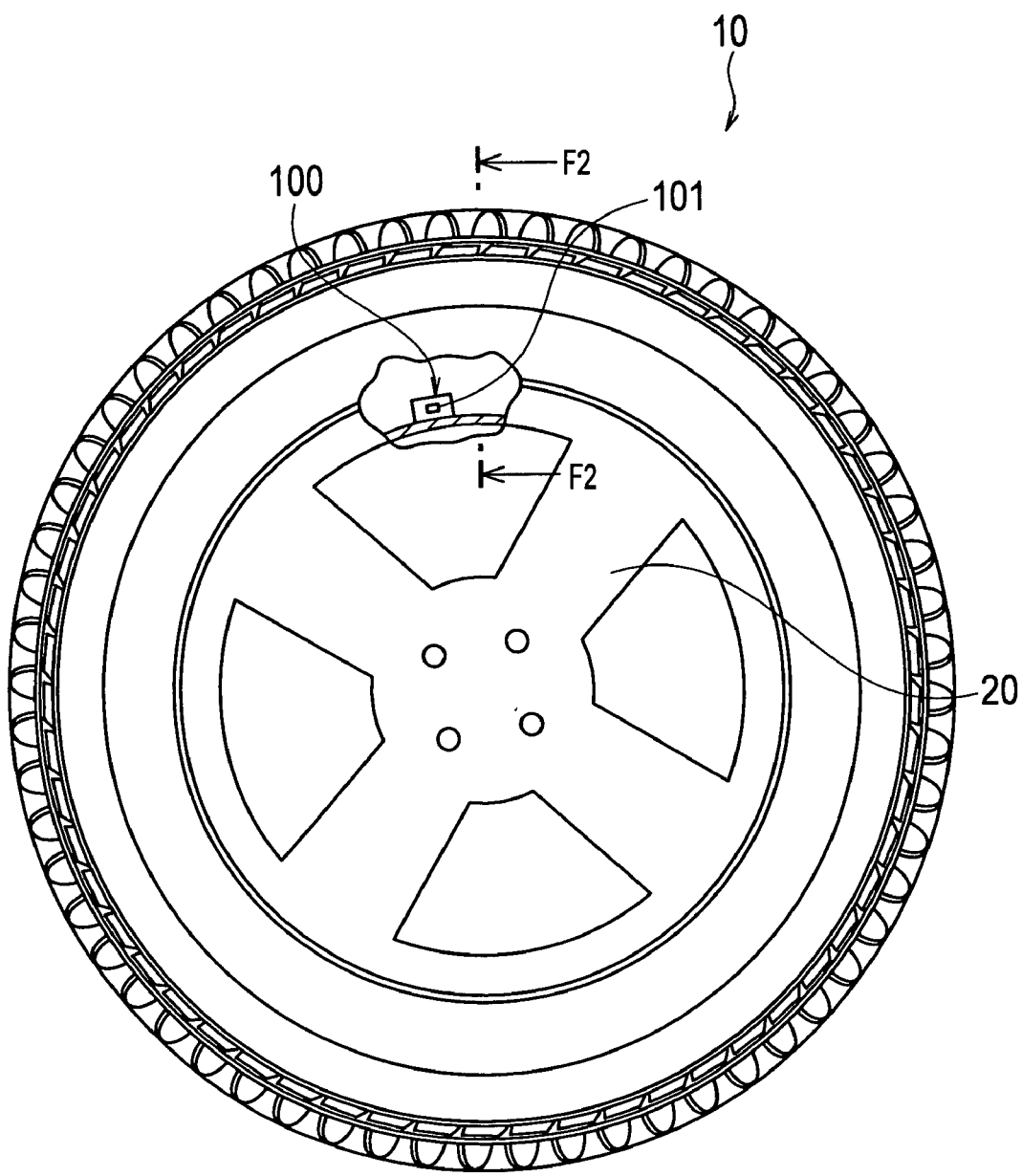
FIG. 1 is a diagram showing a pneumatic tire and a rim wheel according to a first embodiment.

FIG. 1 is a side view of a pneumatic tire 10, and also includes a partially transparent side view of a rim wheel 20. As shown in FIG. 1, a tire data transmission device 100 is provided to the rim wheel 20 on which the pneumatic tire 10 is mounted.

The tire data transmission device 100 is provided with a pressure sensor 101 capable of measuring the internal pressure of the pneumatic tire 10, as will be described later.

(Configuration of Tire Data Transmission Device)

Next, with reference to FIG. 2 and FIG. 3, the configurations of the tire data transmission device 100 and a sensor malfunction determination device 200 will be described.

Figure 2:
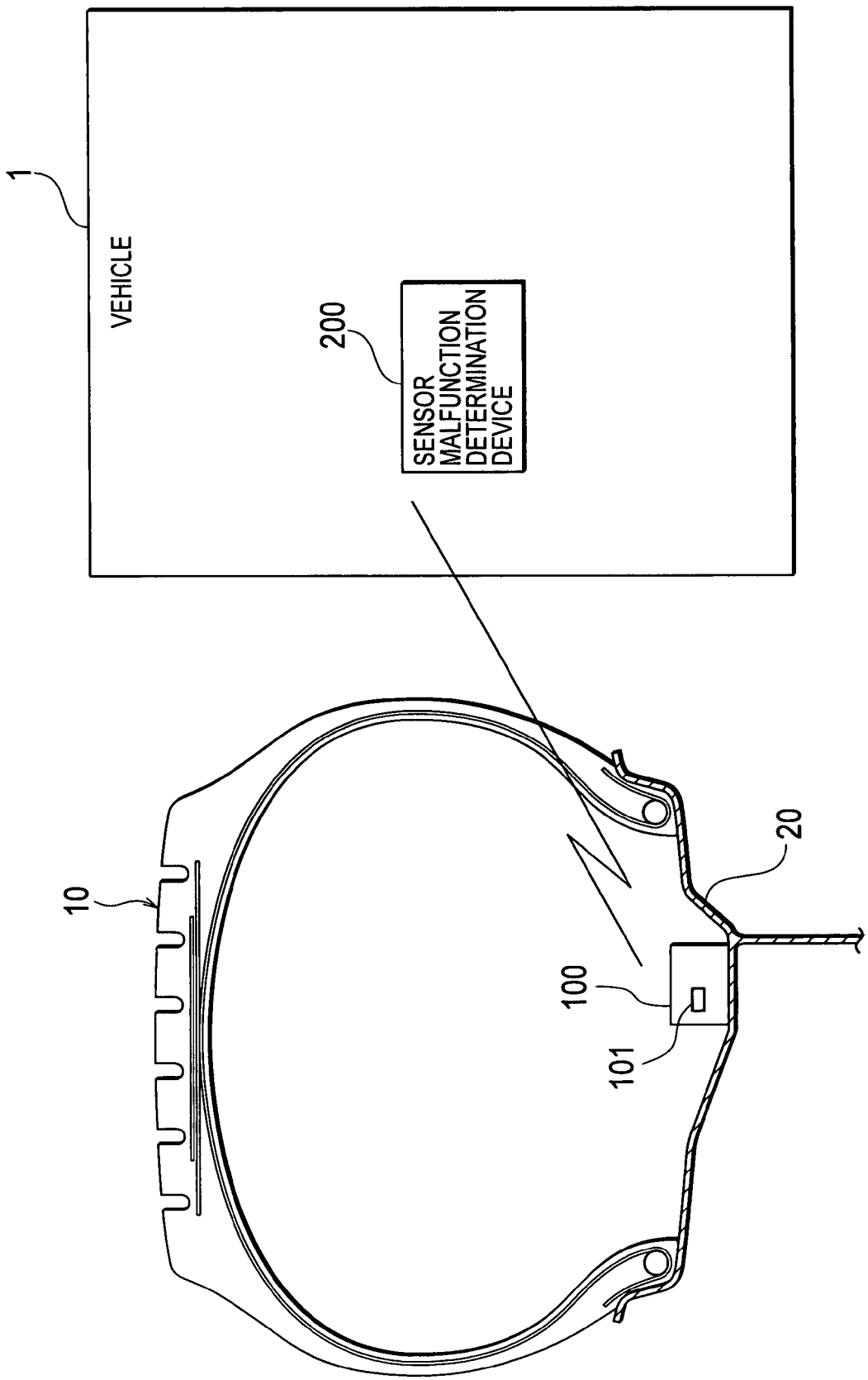
FIG. 2 is a cross-sectional view of the pneumatic tire and the rim wheel in a tread width direction according to the first embodiment, and also shows relations between a tire data transmission device and a sensor malfunction determination device.

FIG. 2 is a cross-sectional view of the pneumatic tire 10 and the rim wheel 20 in the tread width direction. FIG. 2 also shows relations between the tire data transmission device 100 and the sensor malfunction determination device 200.

As shown in FIG. 2, a portion of a wheel drop of the rim wheel 20 is provided with the tire data transmission device 100. In this embodiment, the pressure sensor 101 is connected to the tire data transmission device 100. In addition, the pressure sensor 100 and the tire data transmission device 100 may be wirelessly connected to each other.

The sensor malfunction determination device 200 is provided with a vehicle 1 on which the pneumatic tire 10 is mounted. In addition, the sensor malfunction determination device 200 can be configured as a part of an ECU (Electronic Control Unit) of the vehicle 1.

In this embodiment, the tire data transmission device 100 converts an analog signal outputted from the pressure sensor 101 into digital data, and then transmits the digital data to the sensor malfunction determination device 200 with radio communications.

Next, with reference to FIG. 3, block configurations of the tire data transmission device 100 and the sensor malfunction determination device 200 will be described.

Figure 3:
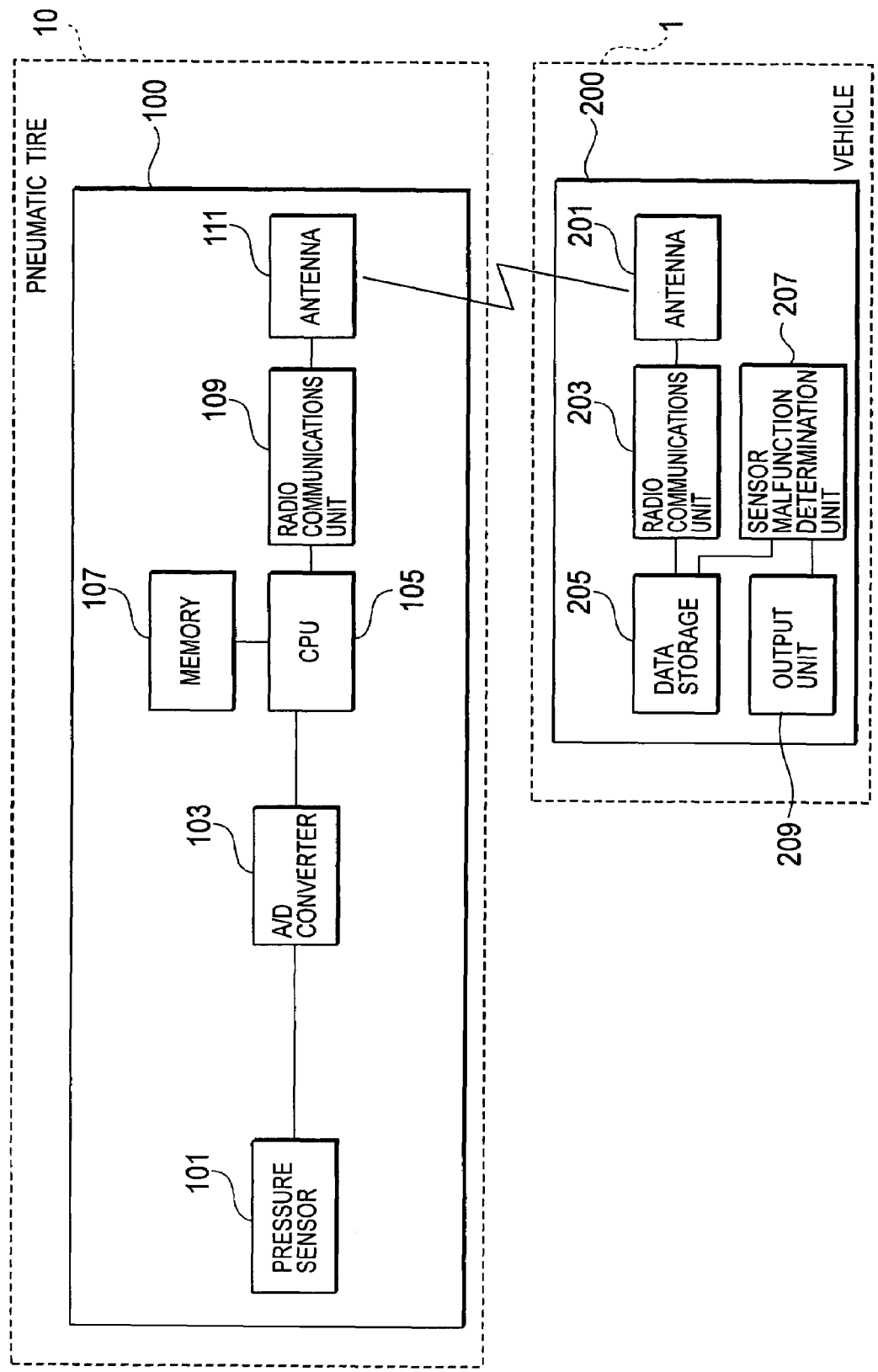
FIG. 3 is a block diagram of the pneumatic tire and the sensor malfunction determination device according to the first embodiment.

As shown in FIG. 3, the tire data transmission device 100 provided in the interior of the pneumatic tire 10 includes the pressure sensor 101, an A/D converter 103, a CPU 105, a memory 107, a radio communications unit 109 and an antenna 111.

The A/D converter 103 is connected to the pressure sensor 101. The A/D converter 103 acquires an analog signal outputted from the pressure sensor 101, and then converts the analog signal into digital data.

The CPU 105 processes the digital data outputted from the A/D converter 103. The CPU 105 outputs digital data to be transmitted to the sensor malfunction determination device 200 to the radio communications unit 109. The digital data to be transmitted includes a pressure value of the pneumatic tire 10.

The memory 107 sequentially stores the digital data converted by the A/D converter. The radio communications unit 109 modulates the digital data outputted from the CPU 105 into a radio signal, and then transmits the radio signal to the sensor malfunction determination device 200 via the antenna 111. The antenna 111 transmits the radio signal outputted by the radio communications unit 109. The antenna 111 is provided in the interior of the tire data transmission device 100.

The sensor malfunction determination device 200 installed in the vehicle 1 includes an antenna 201, a radio communications unit 203, a data storage 205, a sensor malfunction determination unit 207 and an output unit 209.

The antenna 201 receives the radio signal transmitted by the tire data transmission device 100. The antenna 201 is installed in the vehicle 1 at a position in a vicinity of the pneumatic tire 10.

The radio communications unit 203 demodulates the radio signal received by the antenna 201. The radio communications unit 203 stores digital data acquired by the demodulation in the data storage 205.

In addition, it is also possible that the radio communications unit 203 outputs the digital data acquired by the demodulation to a processor (a computer) constituting the ECU installed in the vehicle 1, instead of, or in addition to, storing the digital data in the data storage 205.

The sensor malfunction determination unit 207 detects the pressure value corresponding to the signal outputted by the pressure sensor 101. In addition, the sensor malfunction determination unit 207 constitutes the pressure value detection unit. For example, the sensor malfunction determination unit 207 detects the digital data stored in the data storage 205 as the pressure value corresponding to a signal outputted by the pressure sensor 101.

When the pressure value stored in the data storage 205 is decreasing along the time axis, the sensor malfunction determination unit 207 determines the pressure sensor 101 is not malfunctioning. In addition, the sensor malfunction determination unit 207 also constitutes a determination unit and an approximate expression calculation unit.

The sensor malfunction determination unit 207 calculates an approximate expression on the basis of relations between a plurality of the pressure values stored in the data storage 205 and time points when a plurality of the pressure values are detected. When a value indicating the slope of the calculated approximate expression is a negative predetermined value or less, the sensor malfunction determination unit 207 determines the pressure sensor 101 is not malfunctioning. The negative predetermined value is a value indicating the slope of the approximate expression calculated on the basis of a time variation of the pressure of the pneumatic tire with no failure. In addition, it is preferable that the negative predetermined value is within a range −0.1 and −0.2.

When the pressure value stored in the data storage 205 is constant along the time axis, the sensor malfunction determination unit 207 determines that the pressure sensor 101 is malfunctioning (see FIG. 5B which will be described later).

The output unit 209 outputs the determination result by the sensor malfunction determination unit 207. For example, when the sensor malfunction determination unit 207 determines the pressure sensor 101 is malfunctioning, the output unit 209 outputs a sound effect (for example, a beep sound), a special text (for example, a text of "Please Change the Pressure Sensor"), or a special image (for example, a character image with a certain motion) as the determination result.

(Operation of Sensor Malfunction Determination System)

Next, with reference to FIG. 4 and FIG. 5, a sensor malfunction determination method 1 according to this embodiment will be described.

Figure 4:
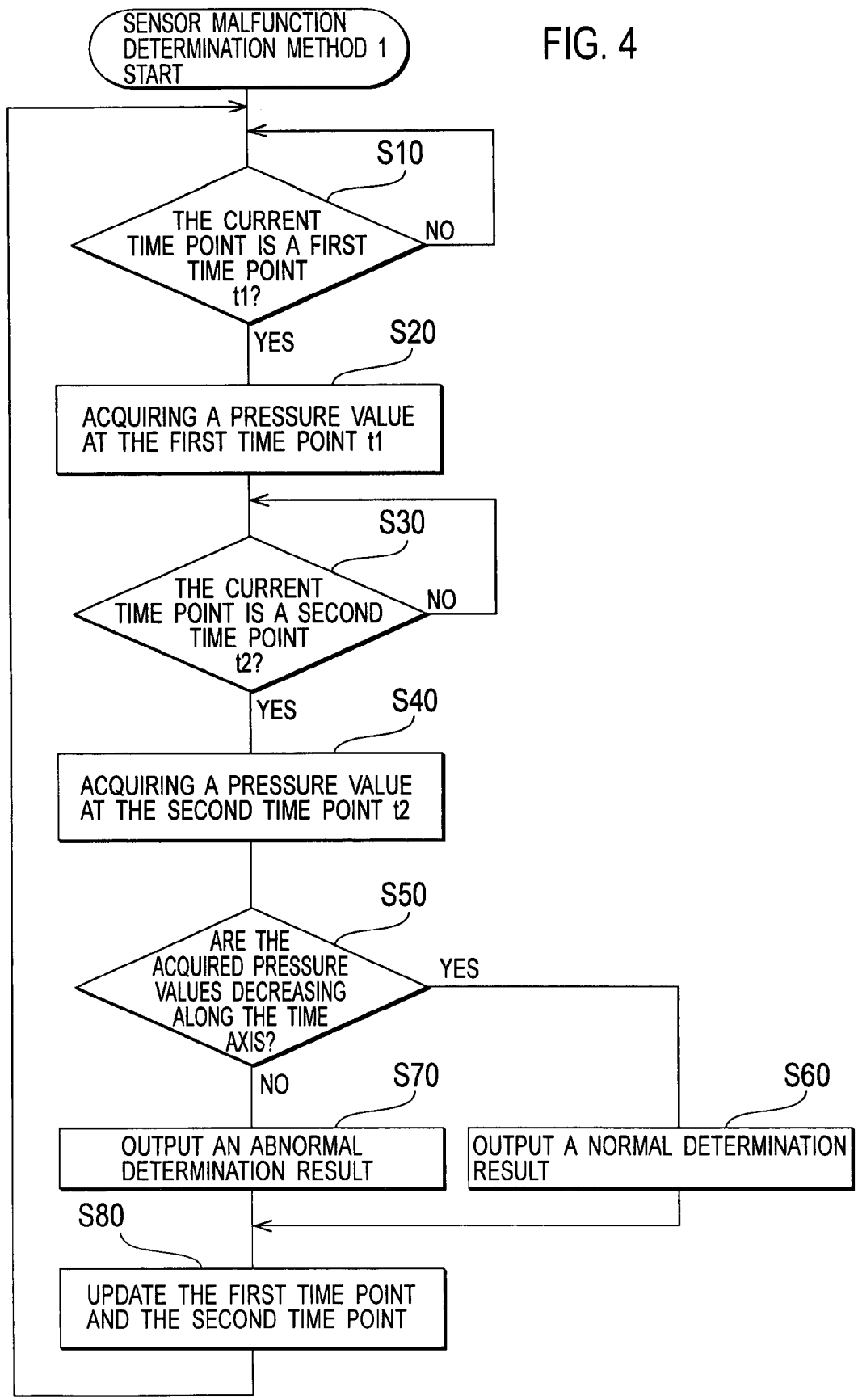
FIG. 4 is a flowchart showing a sensor malfunction determination method 1 according to the first embodiment.
Figure 5A:
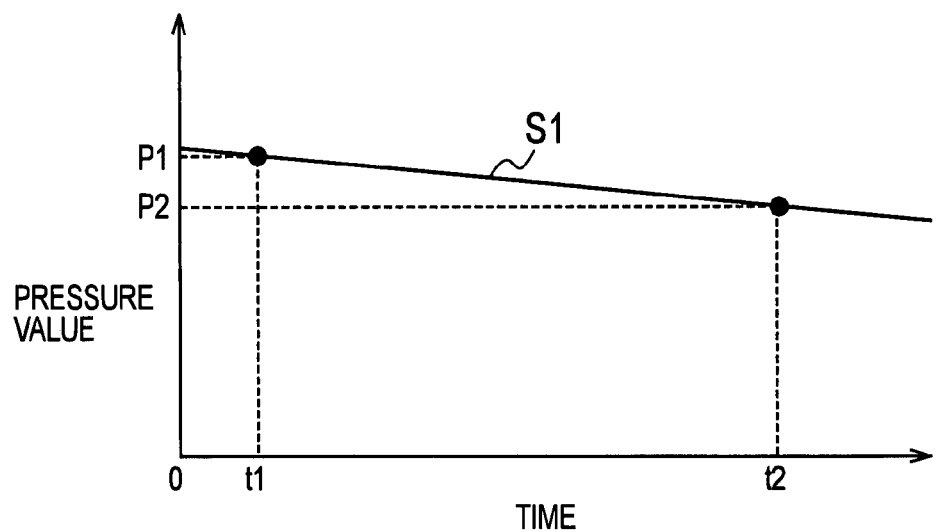
FIG. 5A is a graph showing a variation in the pressure value with respect to the time axis, according to the first embodiment.

FIG. 4 is a flowchart showing the sensor malfunction determination method 1 according to this embodiment. FIG. 5A is a graph showing a variation in the pressure value with respect to the time axis when the pressure sensor 101 is not malfunctioning. FIG. 5B is a graph showing a variation in the pressure value with respect to the time axis when the pressure sensor 101 is malfunctioning.

In this embodiment, the sensor malfunction determination unit 207 uses two pressure values corresponding respectively to a first time point and a second time point for determining whether or not the pressure sensor 101 is malfunctioning. It goes without saying that the pressure values corresponding respectively to three or more time points may be used.

As shown in FIG. 4 and FIG. 5, in S10, the sensor malfunction determination unit 207 determines whether or not the current time point is a first time point t1. When the determination is YES, the sensor malfunction determination unit 207 proceeds to a process in S20. When the determination is NO, the sensor malfunction determination unit 207 repeats this process. It should be noted that the first time point t1 is set in the data storage 205, and is rewritten with another time point after the first time point in a process in S80.

In S20, the sensor malfunction determination unit 207 acquires the pressure value at the first time point t1 from the data storage 205.

In S30, the sensor malfunction determination unit 207 determines whether or not the current time point is a second time point t2. When the determination is YES, the sensor malfunction determination unit 207 proceeds to a process in S40. When the determination is NO, the sensor malfunction determination unit 207 repeats this process. It should be noted that the second time point t2 is set in the data storage 205, and is rewritten with another time point after the second time point t2 in the process in S80.

In S40, the sensor malfunction determination unit 207 acquires the pressure value at the second time point t2 from the data storage 205.

In S50, the sensor malfunction determination unit 207 determines whether or not the acquired pressure values are decreasing along the time axis. Hereinafter, the process in S50 will be described by dividing the process into two patterns.

(1) Descriptions will be given by the case where the pressure value P1 at the first time point t1 and the pressure value P2 at the second time point are different from each other, with reference to FIG. 5A.

As shown in FIG. 5A, the sensor malfunction determination unit 207 calculates an approximate expression S1 by using the pressure value P1 at the first time point t1 and the pressure value P2 at the second time point t2. Here, since there are only two pressure values of P1 and P2, the approximate expression S1 is represented by a line connecting the two points of the respective pressure values P1 and P2.

When a value ($dP/dt$) indicating the slope of the approximate expression S1 is the negative predetermined value or less, the sensor malfunction determination unit 207 determines the pressure values P1 and P2 are decreasing along the time axis, and proceeds to a process in S60.

In addition, when the value indicating the slope of the approximate expression S1 is within an error range including the negative predetermined value, the sensor malfunction determination unit 207 determines the pressure values P1 and P2 are "gradually" decreasing along the time axis, and proceeds to the process in S60.

On the other hand, when the value indicating the slope of the approximate expression S1 is not the negative predetermined value or less, the sensor malfunction determination unit 207 determines that the pressure values P1 and P2 are not decreasing along the time axis, and proceeds to a process in S70.

(2) Descriptions will be given by the case where the pressure value P3 at the first time point t1 and the pressure value P4 at the second time point t2 are the same, with reference to FIG. 5B.

Figure 5B:
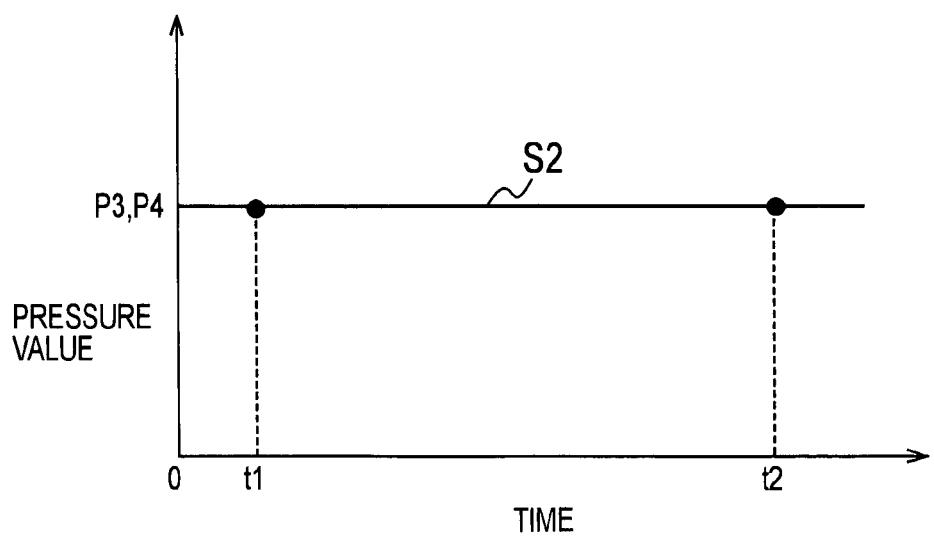
FIG. 5B is another graph showing a variation in the pressure value with respect to the time axis, according to the first embodiment.

As shown in FIG. 5B, since the pressure value P3 and the pressure value P4 are the same, a value indicating the slope of an approximate expression S2 calculated by using the pressure value P3 and the pressure value P4 is 0. Accordingly, since the value indicating the slope of the approximate expression S2 is not the negative predetermined value or less, the sensor malfunction determination unit 207 determines the pressure values P3 and P4 are not decreasing along the time axis. In this case, the sensor malfunction determination unit 207 proceeds to the process in S70.

In S60, the sensor malfunction determination unit 207 outputs a normal determination result indicating the pressure sensor 101 is not malfunctioning to the output unit 209.

For example, when the sensor malfunction determination unit 207 determines the pressure values are "gradually" decreasing along the time axis, the sensor malfunction determination unit 207 outputs the normal determination result. In this case, the sensor malfunction determination unit 207 may output tire normal information. The tire normal information is the information indicating that air in the pneumatic tire is leaking in the course of nature, and that no failure occurs in the pneumatic tire.

In addition, also when the sensor malfunction determination unit 207 determines the pressure values are decreasing along the time axis but are not "gradually" decreasing, the sensor malfunction determination unit 207 outputs the normal determination result. In this case, the sensor malfunction determination unit 207 may output tire abnormal information. The tire abnormal information is the information indicating that air is rapidly leaking from the pneumatic tire, and a high possibility of failure occurs in the pneumatic tire.

In S70, the sensor malfunction determination unit 207 outputs an abnormal determination result indicating the pressure sensor 101 is malfunctioning to the output 209.

In S80, the sensor malfunction determination unit 207 updates the first time point t1 and the second time point t2 to other time points after the first time point t1 and the second time point t2. Then the sensor malfunction determination unit 207 determines in the same procedure as above whether or not the pressure sensor 101 is malfunctioning.

According to this characteristic, when the acquired pressure values are decreasing along the time axis, air in the pneumatic tire 10 is leaking along the time axis. This means the pressure sensor 101 is precisely measuring the internal pressure of the pneumatic tire 10. In this case, since the normal determination result is outputted, the driver or the like of the vehicle can easily find out the pressure sensor 101 is not malfunctioning.

In addition, when the acquired pressure values are constant along the time axis, the pressure sensor 101 is not precisely measuring the internal pressure of the pneumatic tire 10 while air in the pneumatic tire is leaking along the time axis. In this case, since the abnormal determination result is outputted, the driver or the like can find out the pressure sensor 101 is malfunctioning.

Modified Embodiment

In this embodiment, although the sensor malfunction determination unit 207 uses two pressure values to determine whether or not the pressure sensor 101 is malfunctioning, it should be noted that the present invention is not limited to this case. Specifically, the sensor malfunction determination unit 207 may use three or more pressure values to determine whether or not the pressure sensor 101 is malfunctioning.

For example, the sensor malfunction determination unit 207 calculates an approximate expression by a least-square method using three or more pressure values along the time axis. When a value indicating the slope of the calculated approximate expression is the negative predetermined value or less, the sensor malfunction determination unit 207 determines the pressure sensor 101 is not malfunctioning.

According to this characteristic, the sensor malfunction determination unit 207 can calculate a more appropriate approximate expression by using three or more pressure values. Accordingly, the sensor malfunction determination unit 207 can more precisely determine whether or not the pressure sensor 101 is malfunctioning.

Second Embodiment

In the first embodiment, when the acquired pressure values are decreasing along the time axis, the sensor malfunction determination unit 207 determines the pressure sensor 101 is not malfunctioning. However, when the pneumatic tire 10 is inflated, the sensor malfunction determination unit 207 is possible to determine erroneously whether or not the pressure sensor 101 is malfunctioning, as will be described below.

As shown in FIG. 6, for example, after the pneumatic tire 10 is inflated at t3 and the pressure value of the pneumatic tire becomes P4, the pressure value P4 gradually decreases along the time axis. In S20, the pressure value P5 at t4 is acquired, and then the pneumatic tire at t5 is inflated again. Thereafter, in S40, the pressure value P5 at t6 is acquired.

In this case, the pressure value P5 at t4 and the pressure value P5 at t6 are equal. Accordingly, even when the pressure sensor 101 is normally functioning, the sensor malfunction determination unit 207 erroneously determines the pressure sensor 101 is malfunctioning (see FIG. 5B).

In other words, in the first embodiment, when the pneumatic tire 10 is inflated a plurality of times along the time axis, sensor malfunction determination unit 207 is possible to determine erroneously that the pressure sensor 101 is malfunctioning.

In the second embodiment, even when the pneumatic tire 10 is inflated a plurality of times along the time axis, the sensor malfunction determination unit 207 can more precisely determine whether or not the pressure sensor 101 is malfunctioning. Hereinafter, descriptions will be mainly explained by differences between the sensor malfunction determination system and the sensor malfunction determination method according to the first embodiment.

The sensor malfunction determination unit 207 determines an air-filled time point, which is a time point when the pneumatic tire 10 is inflated. It should be noted that the sensor malfunction determination unit 207 constitutes a time point detection unit.

For example, when an elevated level PR in pressure values stored in the data storage 205 exceeds a reference value PK over a reference time period TK, the sensor malfunction determination unit 207 detects the air-filled time point.

When the sensor malfunction determination unit 207 detects the air-filled time point, the sensor malfunction determination unit 207 determines whether or not the pressure sensor 101 is malfunctioning by using the pressure values detected after the air-filled time point.

For example, when the pressure values detected after the air-filled time point are decreasing along the time axis from the time when the air-filled time point is detected, the sensor malfunction determination unit 207 determines the pressure sensor 101 is not malfunctioning.

In addition, the sensor malfunction determination unit 207 calculates an approximate expression from relations between a plurality of pressure values after the air-filled time point and time points corresponding to a plurality of pressure values. When a value indicating the slope of the calculated approximate expression is the negative predetermined value or less, the sensor malfunction determination unit 207 determines the pressure sensor 101 is not malfunctioning.

Moreover, when the pressure values after the air-filled time point are constant along the time axis, the sensor malfunction determination unit 207 determines the pressure sensor 101 is malfunctioning.

Figure 7:
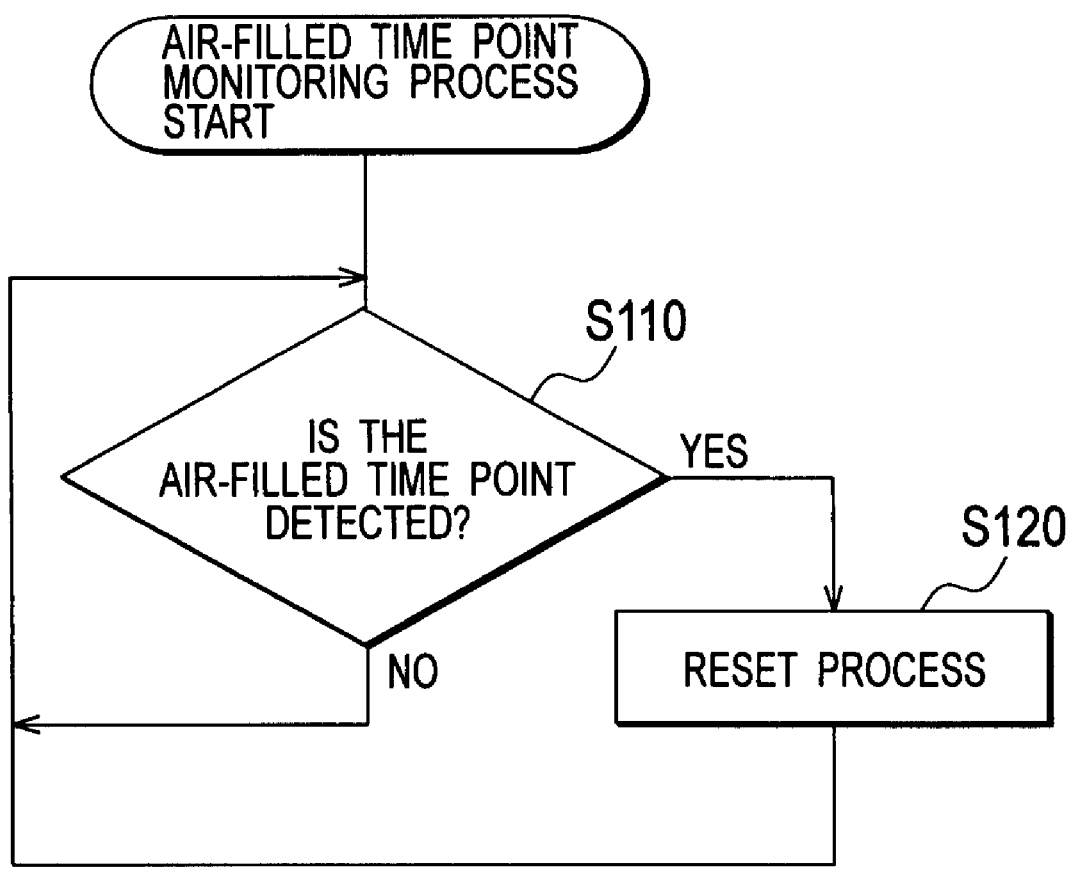
FIG. 7 is a flowchart showing an air-filled time point monitoring process according to the second embodiment.

Next, with reference to FIG. 7 and FIG. 8, a sensor malfunction determination method according to this embodiment will be described. FIG. 7 shows an air-filled time point monitoring process according to this embodiment. The air-filled-time-point monitoring process is executed in parallel to the processes in the sensor malfunction determination method 1 shown in FIG. 4.

As shown in FIG. 7, in S110, when the air-filled time point is detected, the sensor malfunction determination unit 207 proceeds to a process in S120. When the air-filled time point is not detected, the sensor malfunction determination unit 207 repeats this process.

Figure 8A:
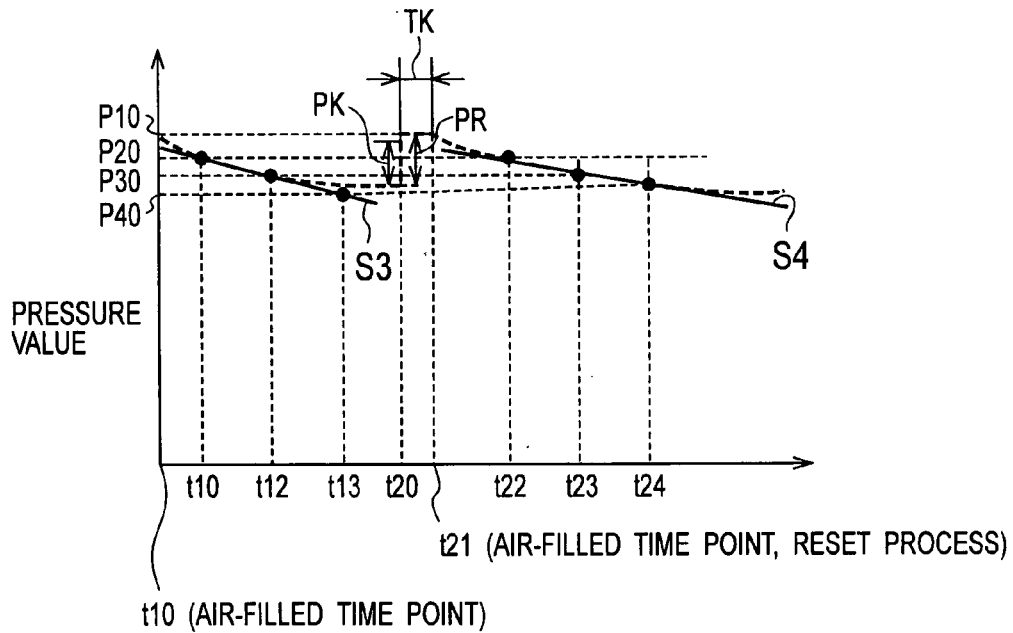
FIG. 8 is a graph showing a variation in the pressure value with respect to the time axis, according to the second embodiment.

For example, as shown in FIG. 8A, at t20, when the increase PR in the pressure value of the pressure sensor 101 exceeds the reference value PK, and concurrently when the time period of the increase PR exceeds the reference time period TK, the sensor malfunction determination unit 207 detects t21 as an air-filled time point. In this case, the sensor malfunction detection unit 207 proceeds to the process in S120.

Figure 8B:
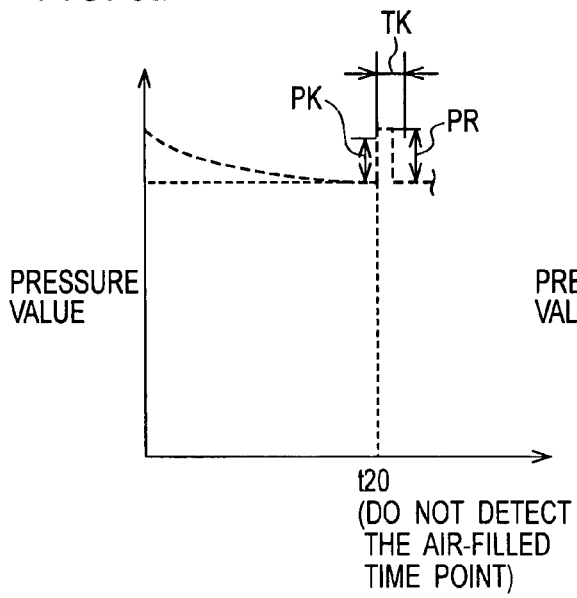

As shown in FIG. 8B, at t20, when the elevated level PR of the pressure value of the pressure sensor 101 exceeds the reference value PK, but concurrently when the time period of the increase PR does not exceed the reference time period TK, the sensor malfunction determination unit 207 does not detect the air-filled time point.

Figure 8C:
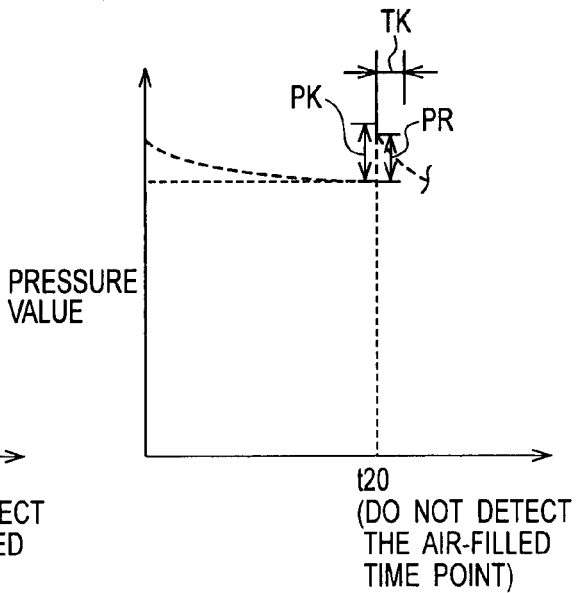

As shown in FIG. 8C, at t20, when the elevated level PR of the pressure value of the pressure sensor 101 does not exceed the reference value PK, and concurrently when the time period of the elevated level PR does not exceed the reference time period TK, the sensor malfunction determination unit 207 does not detect the air-filled time point.

In S120, the sensor malfunction determination unit 207 updates the first time point and the second time point having been set in the sensor malfunction determination method 1 shown in FIG. 4 with other time periods after the air-filled time point. Concurrently, the sensor malfunction determination unit 207 starts the processes from S1 in the sensor malfunction determination method 1 shown in FIG. 4.

For example, as shown in FIG. 8A, when the sensor malfunction determination unit 207 detects t21 as the air-filled time point, the sensor malfunction determination unit 207 updates a first time point t10 and a second time point t12 before the air-filled time point, respectively, with t22 and t23 after the air-filled time point. Concurrently, the sensor malfunction determination unit 207 starts the processes from S1 in the sensor malfunction determination method 1 shown in FIG. 4.

Accordingly, when the air-filled time point t21 is detected, the sensor malfunction determination unit 207 does not use the pressure values detected before the air-filled time point t21, but uses only the pressure values after the air-filled time point t21. In other words, the sensor malfunction determination unit 207 does not use an approximate expression S3 before the air-filled time point t21, but uses the approximate expression S4 after the air-filled time point t21. For this reason, even when the pneumatic tire 10 is inflated, the sensor malfunction determination unit 207 can more appropriately determine whether or not the pressure sensor 101 is malfunctioning.

In addition, when the elevated level PR of the pressure value of the pressure sensor 101 exceeds the reference value PK over the reference time period TK, the air-filled time point is detected. Accordingly, the sensor malfunction determination unit 207 can detect the air-filled time point via the pressure sensor 101 without using a special device for detecting the air-filled time point.

Third Embodiment

In the first and second embodiments, when the pressure value is decreasing along the time axis, the sensor malfunction determination unit 207 determines the pressure sensor 101 is not malfunctioning.

On the other hand, a third embodiment is different in that the sensor malfunction determination unit 207 determines whether or not the pressure sensor 101 is malfunctioning on the basis of the amplitude and a frequency of a pressure signal indicating a variation in pressure value along the time axis. Hereinafter, descriptions will be given mainly by differences between the sensor malfunction determination device and the sensor malfunction determination method according to each of the first and second embodiments.

When the amplitude of the pressure signal indicating a variation in pressure value along the time axis, which value is stored in the data storage 205, exceeds a reference amplitude K, and concurrently when the frequency of the pressure signal exceeds the reference frequency over a predetermined time period, the sensor malfunction determination unit 207 determines the pressure sensor 101 is malfunctioning.

Next, with reference to FIG. 9 to FIG. 11, a sensor malfunction determination method 2 according to this embodiment will be explained.

Figure 10:
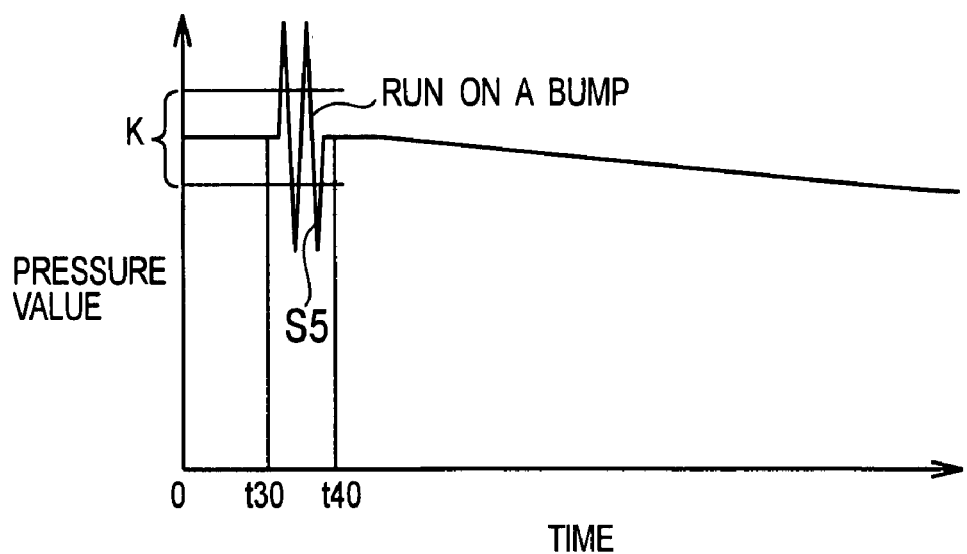
FIG. 10 is a graph showing a variation in the pressure value with respect to the time axis, according to the third embodiment.

Here, FIG. 10 is a graph showing a variation 1 in the pressure value with respect to the time axis. The variation 1 in the pressure value is detected when the pneumatic tire 10 is rotated on a roughness of a road surface when the pressure sensor 101 is not malfunctioning.

Figure 11:
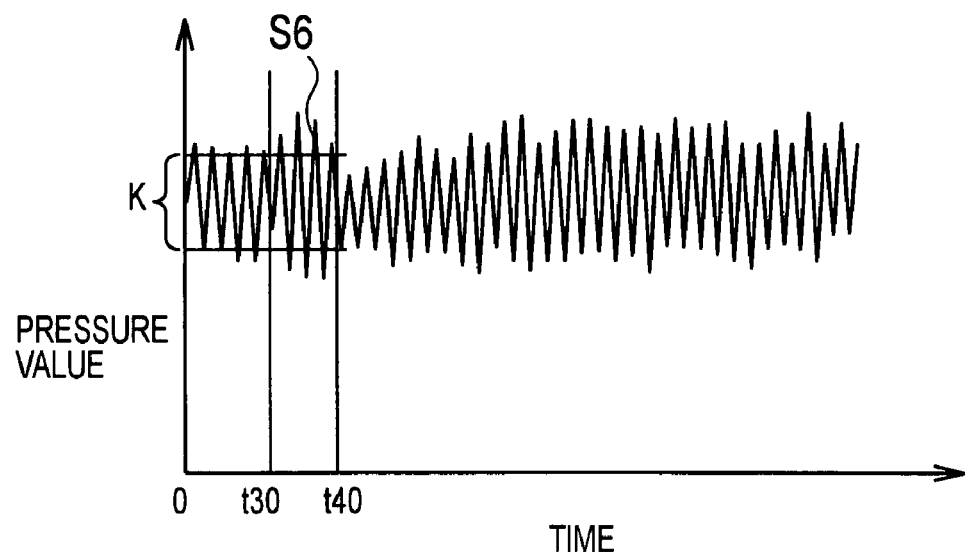
FIG. 11 is another graph showing a variation in the pressure value with respect to the time axis, according to the third embodiment.

FIG. 11 is a graph showing a variation 2 in the pressure value with respect to the time axis. The variation 2 in the pressure value is detected when the pneumatic tire 10 is rotated on the roughness of the road surface when the pressure sensor 101 is malfunctioning.

Figure 9:
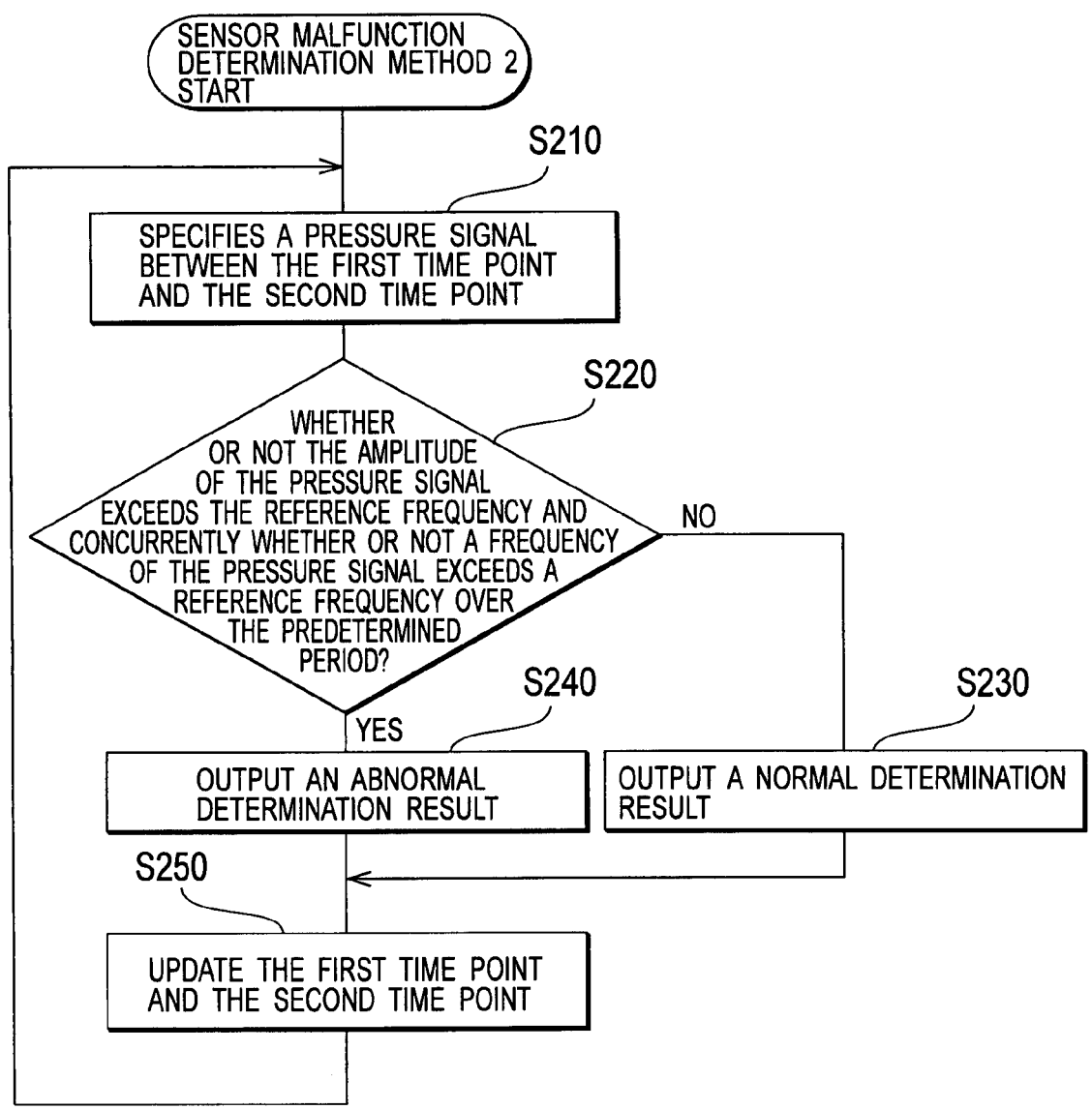
FIG. 9 is a flowchart showing a sensor malfunction determination method 2 according to a third embodiment.

As shown in FIG. 9 to FIG. 11, in S210, the sensor malfunction determination unit 207 refers to the contents stored in the data storage 205 so as to specify a pressure signal between the first time point and the second time point.

In S220, the sensor malfunction determination unit 207 determines whether or not the amplitude of the pressure signal specified in S210 exceeds the reference amplitude K, and concurrently whether or not the frequency of the pressure signal exceeds the reference frequency between the first time point and the second time point (over the predetermined time period). When the determination is YES, the sensor malfunction determination unit 207 proceeds to a process in S240. When the determination is NO, the sensor malfunction determination unit 207 proceeds to a process in S230. Hereinafter, the process in S220 will be explained by dividing the process into two patterns.

(1) Description will be given, with reference to FIG. 10, by the case where the pneumatic tire 10 is rotated on the roughness of the road surface when the pressure sensor 101 is not malfunctioning.

As shown in FIG. 10, when the amplitude of the pressure signal S5 having been specified exceeds the reference amplitude K, and concurrently when the frequency of the pressure signal S5 does not exceed the reference frequency between a first time point t30 and a second time point t40 (over the predetermined time period). In this case, it is highly possible that the pressure sensor 101 is not malfunctioning, but the pneumatic tire 10 has been rotated on the roughness of the road surface.

In this case, the sensor malfunction determination unit 207 determines the pressure sensor 101 is not malfunctioning, and proceeds to the process in S230.

(2) Description will be given, with reference to FIG. 11, by the case where the pressure sensor 101 is malfunctioning.

As shown in FIG. 11, when the amplitude of the pressure signal S6 having been specified exceeds the reference amplitude K, and concurrently when the frequency of the pressure signal S6 exceeds the reference frequency between the first time point t30 and the second time point t40 (over the predetermined time period). In this case, it is highly possible that the internal pressure of the pneumatic tire 10 is varying not because the pneumatic tire 10 is rotated on the roughness of the road surface, but because the pressure sensor 101 is malfunctioning.

In this case, the sensor malfunction determination unit 207 determines the pressure sensor 101 is malfunctioning, and proceeds to the process in S240.

In S230, the sensor malfunction determination unit 207 outputs, a normal determination result indicating that the pressure sensor 101 is not malfunctioning to the output 209.

In S240, the sensor malfunction determination unit 207 outputs, an abnormal determination result indicating that the pressure sensor 101 is malfunctioning to the output unit 209.

In S250, the sensor malfunction determination unit 207 updates the first time point and the second time point to other time points after the first time point and the second time point. Then, the sensor malfunction determination unit 207 determines whether or not the pressure sensor 101 is malfunctioning in the same process as mentioned above.

According to this characteristic, when the amplitude of the pressure signal exceeds the reference amplitude, and concurrently when the frequency of the pressure signal exceeds the reference frequency over the predetermined time period, it is highly possible that the internal pressure of the pneumatic tire 10 is varying not because the pneumatic tire 10 is rotated on the roughness of the road surface, but because the pressure sensor 101 is malfunctioning.

In this case, since the abnormal determination result is outputted, the driver or the like can easily find out the pressure sensor 101 is malfunctioning.

Other Embodiments

In addition, the pressure sensor 101 may be provided in the interior of the pneumatic tire 10. In this case, since the pressure sensor 101 directly measures the pressure value of the pneumatic tire 10, the pressure sensor 101 can measure the pressure value of the pneumatic tire 10 with high precision.

In addition, the number of the pressure sensor 101 is not limited to one, but a plurality of the pressure sensors 101 may be provided. When the average value of the pressure values measured by a plurality of the pressure sensors 101 is decreasing along the time axis, the sensor malfunction determination device 200 may be configured to determine a plurality of the pressure sensors 101 are not malfunctioning.

In this case, the sensor malfunction determination device 200 does not determine whether or not a plurality of pressure sensors 101 are malfunctioning only with the pressure value measured by one pressure sensor 101, but determines whether or not a plurality of pressure sensors 101 are malfunctioning with the average of the pressure values measured by a plurality of pressure sensors 101. For this reason, the sensor malfunction determination device 200 can determine, with high precision, whether or not a plurality of the pressure sensors 101 are malfunctioning.

In addition, when the average of the pressure values measured by a plurality of the pressure sensors 101 is constant along the time axis, the sensor malfunction determination device 200 may be configured to determine a plurality of the pressure sensors 101 are malfunctioning. Moreover, the sensor malfunction determination device 200 may be configured to determine a plurality of pressure sensors 101 are malfunctioning, when the amplitude of a pressure signal indicating a variation in the average of the pressure values measured by a plurality of pressure sensors 101 along the time axis exceeds the reference amplitude, and concurrently when the frequency of the pressure signal exceeds the reference frequency over the predetermined time period.

In addition, the sensor malfunction determination device 200 may be configured to determine whether or not a plurality of the pressure sensors 101 are malfunctioning with the pressure values measured by a plurality of pressure sensors 101 after an air-filled time point having been detected.

In addition, the sensor malfunction determination device 200 is provided separately from the tire data transmission device 100. However, the present invention is not limited to this case, and the sensor malfunction determination device 200 may be provided in the interior of the tire data transmission device 100.

The examples of the present invention have been described so far. However, only specific examples have been shown, and these examples do not limit the present invention. Accordingly, it is possible to modify, as appropriate, the designs of specific configurations and the like of the respective components. In addition, any of the configurations of the respective embodiments and the configurations of the respective modified embodiments may be combined with one another. Moreover, in terms of the operations and effects of each of the embodiments and the modified embodiments, only the most preferable operations and effects, derived from the present invention, are listed. For this reason, the operations and effects according to the present invention are not limited to those described in each of the embodiments and the modified embodiments.

INDUSTRIAL APPLICABILITY

According to the characteristics of the present invention, it is possible to inform the driver or the like whether or not the pressure sensor for measuring the internal pressure of the pneumatic tire is malfunctioning.

The invention claimed is:

1. A sensor malfunction determination device comprising:
a pressure value detection unit configured to detect a pressure value corresponding to a signal outputted by a pressure sensor capable of measuring the internal pressure of a pneumatic tire;
a determination unit configured to determine that the pressure sensor is functioning properly when the detected pressure value is decreasing along a time axis; and
an output unit configured to output the determination result made by the determination unit,
wherein the determination unit is configured to determine the pressure sensor is malfunctioning when the amplitude of a pressure signal indicating a variation in the detected pressure value along the time axis exceeds a reference amplitude, and concurrently when a frequency of the pressure signal exceeds a reference frequency over a predetermined time period.

2. The sensor malfunction determination device according to claim 1, further comprising an approximate expression calculation unit configured to calculate an approximate expression on the basis of a plurality of the pressure values and time points when a plurality of the pressure values are detected,
wherein the determination unit determines that the pressure sensor is functioning properly when a value indicating the slope of the calculated approximate expression is a negative predetermined value.

3. The sensor malfunction determination device according to claim 1, wherein the determination unit determines that the pressure sensor is malfunctioning, when the detected pressure value is constant along the time axis.

4. The sensor malfunction determination device according to claim 1, further comprising a time point detection unit configured to detect an air-filled time point, which is a time point when the pneumatic tire is inflated,
wherein the determination unit uses the pressure value detected after the air-filled time point on the basis of the detected air-filled time point.

5. The sensor malfunction determination device according to claim 4, wherein the time point detection unit detects the air filled time point when an increase in the detected pressure value exceeds a reference value over a reference time period.

6. A sensor malfunction determination method comprising:
a first step of detecting a pressure value corresponding to a signal outputted by a pressure sensor capable of measuring the internal pressure of a pneumatic tire;
a second step of determining the pressure sensor is functioning properly when the detected pressure value is decreasing along a time axis; and
a third step of outputting the determination result made by the determination unit,
wherein in the second step, the pressure sensor is determined to malfunction when the amplitude of a pressure signal indicating a variation in the detected pressure value along the time axis exceeds a reference amplitude, and concurrently when a frequency of the pressure signal exceeds a reference frequency over a predetermined time period.

7. The sensor malfunction determination method according to claim 6, further comprising a fourth step of calculating an approximate expression on the basis of a plurality of the pressure values and time points when a plurality of pressure values are detected, wherein the method in the second step, the pressure sensor is determined to function properly when a value indicating the slope of the calculated approximate expression is a negative predetermined value.

8. The sensor malfunction determination method according to claim 6, wherein in the second step, the pressure sensor is determined to malfunction when the detected pressure value is constant along the time axis.

9. The sensor malfunction determination method according to claim 6, further comprising a fourth step of detecting an air-filled time point, which is a time point when the pneumatic tire is inflated, wherein the method in the second step, the pressure value detected after the air-filled time point is used on the basis of the detected air-filled time point.

10. The sensor malfunction determination method according to claim 9, wherein in the fourth step, the air-filled time point is detected when an increase in the detected pressure value exceeds a reference value over a reference time period.

11. A sensor malfunction determination device comprising:

a pressure value detection unit configured to detect a pressure value corresponding to a signal outputted by a pressure sensor capable of measuring the internal pressure of a pneumatic tire;

a determination unit configured to determine that the pressure sensor is functioning properly when the detected pressure value is decreasing along a time axis;

an output unit configured to output the determination result made by the determination unit; and a time point detection unit configured to detect an air-filled time point, which is a time point when the pneumatic tire is inflated, wherein the determination unit uses the pressure value detected after the air-filled time point on the basis of the detected air-filled time point, and wherein the time point detection unit detects the air filled time point when an increase in the detected pressure value exceeds a reference value over a reference time period.

12. A sensor malfunction determination method comprising:

a first step of detecting a pressure value corresponding to a signal outputted by a pressure sensor capable of measuring the internal pressure of a pneumatic tire;

a second step of determining the pressure sensor is functioning properly when the detected pressure value is decreasing along a time axis;

a third step of outputting the determination result made by the determination unit; and a fourth step of detecting an air-filled time point, which is a time point when the pneumatic tire is inflated, wherein the method in the second step, the pressure value detected after the air-filled time point is used on the basis of the detected air-filled time point, and wherein in the fourth step, the air-filled time point is detected when an increase in the detected pressure value exceeds a reference value over a reference time period.

* * * * *